(12) United States Patent
Guimaraes

(10) Patent No.: US 9,344,138 B2
(45) Date of Patent: May 17, 2016

(54) METHOD AND SYSTEM FOR PROVIDING IMPROVED HIGH POWER RF SPLITTER/COMBINER

(71) Applicant: Fernando Pinheiro Guimaraes, Santa Rita do Sapucai (BR)

(72) Inventor: Fernando Pinheiro Guimaraes, Santa Rita do Sapucai (BR)

(73) Assignee: Emhiser Research, Inc., Verdi, NV (US)

( * ) Notice: Subject to any disclaimer, the term of this patent is extended or adjusted under 35 U.S.C. 154(b) by 0 days.

(21) Appl. No.: 14/060,606

(22) Filed: Oct. 22, 2013

(65) Prior Publication Data

US 2015/0200435 A1 Jul. 16, 2015

Related U.S. Application Data

(60) Provisional application No. 61/717,085, filed on Oct. 22, 2012.

(51) Int. Cl.
*H01P 5/12* (2006.01)
*H04B 1/40* (2015.01)

(52) U.S. Cl.
CPC ........................... *H04B 1/40* (2013.01)

(58) Field of Classification Search
CPC .......... H01P 51/12; H04B 1/40; H04B 1/581; H01F 19/04
USPC .......................................... 333/119, 131, 136
See application file for complete search history.

(56) References Cited

U.S. PATENT DOCUMENTS

| 4,945,321 | A | * | 7/1990 | Oppelt et al. | 333/119 |
| 5,204,644 | A | * | 4/1993 | Dalisda | 333/127 |
| 6,744,312 | B2 | | 6/2004 | White et al. | |
| 7,755,452 | B2 | * | 7/2010 | Knickerbocker et al. | 333/131 |
| 7,920,035 | B2 | | 4/2011 | Panaghiston | |
| 2003/0155991 | A1 | * | 8/2003 | Ji | 333/119 |
| 2010/0194492 | A1 | * | 8/2010 | Rijssemus | 333/131 |

* cited by examiner

*Primary Examiner* — Robert Pascal
*Assistant Examiner* — Kimberly Glenn
(74) *Attorney, Agent, or Firm* — Duncan Galloway Egan Greenwald, PLLC; Kevin T. Duncan

(57) ABSTRACT

The present invention provides an improved high power RF (radio frequency) splitter/combiner that is appropriate for use in a wide range of frequencies and applications, including KHz to GHz, including in the L, S, and C bands. The present invention provides a high power RF splitter/combiner that operates without the inconvenience of the balanced isolation load requirement of the Wilkinson splitter/combiner topology—i.e. the isolation load returns to ground rather than being connected between a pair of floating nodes.

10 Claims, 8 Drawing Sheets

METHOD AND SYSTEM FOR PROVIDING IMPROVED HIGH POWER RF SPLITTER/COMBINER

CROSS-REFERENCE TO RELATED APPLICATION

The present application claims benefit of priority to and is the non-provisional application of U.S. Provisional Patent Application No. 61/717,085, filed Oct. 22, 2012, entitled "METHOD AND SYSTEM FOR PROVIDING IMPROVED HIGH POWER RF SPLITTER/COMBINER" (Guimaraes), which is hereby incorporated by reference herein in its entirety.

FIELD OF THE INVENTION

The present invention relates generally to apparatus and method for amplifying radio frequency (RF) signals, including microwave RF signals. More particularly, the present invention pertains to an improved high power RF splitter/combiner for RF amplifier applications.

BACKGROUND OF THE INVENTION—INCORPORATION BY REFERENCE

This patent application hereby incorporates by reference herein in their entirety the following: U.S. Provisional Patent Application No. 61/340,960, filed Mar. 25, 2010, entitled "METHOD AND SYSTEM FOR PROVIDING AUTOMATIC GATE BIAS FOR FIELD EFFECT TRANSISTORS," U.S. Pat. No. 8,188,794, issued May 29, 2012, and entitled "METHOD AND SYSTEM FOR PROVIDING AUTOMATIC GATE BIAS FOR FIELD EFFECT TRANSISTORS," and U.S. Utility Patent Application No. 13/481,906, filed May 28, 2012, entitled "METHOD AND SYSTEM FOR PROVIDING AUTOMATIC GATE BIAS SEQUENCING FOR FIELD EFFECT TRANSISTORS."

In addition, as taught by Lautzenhiser et al., in U.S. Pat. No. 7,936,218 on May 3, 2011, which is incorporated herein by reference, two or more solid-state electronic devices, or at least one solid-state electronic device and at least one other electronic device, are connected in series between positive and negative terminals of a dc source voltage, thereby proportioning the dc source voltage between or among the electronic devices. The solid-state electronic devices may be gallium arsenide field-effect transistors (GaAsFETs) or any other type of solid-state electronic device. All of the dc series-connected electronic devices may use the same current flow, or some current may be bypassed around an electronic device that uses less current than an other current-sharing device. Alternately, two solid-state electronic devices that use less current are connected in dc parallel in a stack with two or more solid-state electronic devices to best utilize, not only the dc source voltage, but also the current required by the power-amplifying FETs. If the solid-state electronic devices are field-effect transistors (FETs), the FETs are stacked like a totem pole with the drain of a top, or upper, FET being operatively connected to a relatively high positive potential, a source terminal of the top FET being connected to a drain terminal of a lower FET, and a source terminal of the lower FET being connected to a lower voltage. An RF power splitter is used to split the RF input two or more ways for the gates of the FETs. In various ones of the embodiments, an RF power combiner is connected to the drain terminals of the FETs to combine the RF outputs. A negative gate-to-source bias for the lower FET controls current flow through all FETs, which in turn controls power amplification. In addition to proportioning a dc source voltage between, or among, a plurality of solid-state amplifying devices in fixed proportions for the purpose of providing dc voltages that are usable by various types of solid-state amplifying devices, the dc source voltage may be variably proportioned between, or among, a plurality of solid-state amplifying devices. The dc source voltage may be variably proportioned for the purpose of variably shifting a phase angle of an RF output, or the dc source voltage may be variably proportioned for the purpose of selectively proportioning, or switching, RF power from one RF output and an antenna to an other RF output and its antenna. A power combiner is used to combine the RF signals after being power amplified by the FETs, in other embodiments, the RF signals are used separately. Separate RF inputs, which may be at different frequencies, different levels, and different modulation types, are separately amplified, and then combined to produce both RF signals in a single RF output.

The present invention provides an improved high power RF (radio frequency) splitter/combiner that is appropriate for use in a wide range of frequencies and applications, including KHz to GHz, including in the L, S, and C bands. The S band ranges from 2 to 4 GHz and is part of the microwave band of the electromagnetic spectrum used in weather radar, surface ship radar, and communications satellites applications. The L band, referred to as the IEEE L band, is a portion of the microwave band of the electromagnetic spectrum ranging from 1 to 2 GHz. The L band is used in communications, digital audio broadcast, satellite communications, telecommunications, military, telemetry as well as other applications. For instance, the Global Positioning System (GPS) utilizes carriers in the L band. Uses for IEEE C-band frequencies, which extend from 4 to 8 GHz, include satellite communications, weather radar, and military applications.

Exemplary uses of the RF splitter-combiner of the present invention are transmission applications, including transmitters, receivers, and power amplifiers. Applications for the invention include two-way private radio communication, broadband amplifiers, cellular infrastructure, test instrumentation, and Class A, AB, Linear amplifiers suitable for OFDM, W-CDMA, EDGE, and CDMA waveforms. Microstrip Splitter-combiners preferably provide minimal insertion loss with high isolation between output ports along with phase and amplitude balance and may be arranged in N, SMA, BNC, TNC and 7/16 DIN connector styles for frequencies from 0.4 to 18.0 GHz for narrow, octave, dual and multi-octave band applications.

Power dividers or splitters are what the name implies—a device to divide a signal into two or more parts. They may also be used as combiners since they are fully bi-directional. The outputs may have an amplitude or phase relationship and will usually cover a specific frequency range. For example, an in-phase divider will have outputs that have a zero degree relationship to each other and have the same amplitude. A 180 degree divider has equal amplitude outputs but they will be 180 degrees apart in phase. Another example is a device having both in-phase and 180 degree outputs. A 90 degree or quadrature divider will have outputs that are 90 degrees apart with the same amplitudes over a specific frequency range. The range is usually limited to a 2:1 maximum ratio. A narrow-band divider will usually cover a specific frequency but can be used over a 10% bandwidth quite well.

In-phase power dividers, such as those available from Emhiser Tele-Tech, Inc. of Belgrade, Mont., are available for 2-way up through 32-way. Impedances are available for both 50 ohm and 75 ohm. Maximum signal level is typically +20 dbm but higher power levels can be handled with special considerations. Dividers able to handle high power preferable will require that any unused inputs/outputs be terminated into a suitable load to properly dissipate the energy outside of the unit. Power dividers can be used in any application that a signal needs to be divided or multiple signals combined. For example, multiple devices that require the same signal input, splitting a signal for feeding many antennas or splitting a signal for use in a feedback system. Typically, combiners are used to integrate multiple signals into one signal stream, combining the outputs of several amplifiers before feeding the signal to an antennae or, as in the case of a cell phone system, combining many phone calls into one transmitted signal.

A widely used design is the Wilkinson Power Divider, which is a specific class of power divider circuit that can achieve isolation between the output ports while maintaining a matched condition on all ports. The Wilkinson design can also be used as a power combiner because it is made up of passive components and hence reciprocal. This circuit is widely used in RF communication systems utilizing multiple channels because its high degree of isolation between the output ports prevents crosstalk between the individual channels.

SUMMARY OF THE INVENTION

The present invention is intended for many uses and applications including in design and manufacture of airborne and ground-based telemetry equipment, including aircraft (manned and unmanned), ground vehicles, fixed systems and military telemetry equipment. Telemetry system components include transmitters, receivers, and power amplifiers in a wide variety of frequency ranges. As in many areas, there is a growing need and desire for telemetry components that are low cost, low power consumption (for battery, heat and other concerns), light weight, low failure rate, less complex, compact, more robust and rugged design for harsh environments, and of course high performance.

While the Wilkinson splitter-combiner currently is the most popular combiner for high power applications, it is not without its drawbacks. The present invention provides a high power RF splitter/combiner that operates without the inconvenience of the balanced isolation load requirement of the Wilkinson splitter/combiner topology—i.e. the isolation load returns to ground rather than being connected between a pair of floating nodes.

In addition to the above advantage the splitter-combiner of the present invention also has several other advantages over other configurations such as nonhomogeneous microstripline combiners as well as homogeneous stripline configurations, which are discussed hereinbelow.

In one embodiment, the present invention provides an RF communications device capable of being used as a splitter or a combiner, the communications device comprising: at least three ports, wherein: when used as a splitter, a first port serving as an RF input, second and third ports providing a first RF output and a second RF output, respectively; when used as a combiner, the first port serving as an RF output, second and third ports connectable to a first RF input and a second RF input, respectively; at least four transmission line elements, each comprising a first conductor element and a second conductor element, wherein at least three of the transmission line elements are configured so that each first conductor element is in electric communication with an RF signal and each second conductor is in electric communication with a ground reference, and at least one transmission line element configured so that the first conductor is in electric communication at one end with ground and at the other end with an RF signal and the second conductor is in electric communication at one end with ground and at the other end with an isolation load element, which is also in electric communication with one first conductor of a other transmission line element; whereby the isolation load is grounded. In addition, the present invention may be further characterized as follows: the transmission line elements are one or more of a coaxial cable, a stripline or a microstripline; a fourth port associated with the isolation load element, the fourth port being accessible externally; the isolation load element is internal to a housing associated with the communications device and not accessible externally; a second communications device coupled serving as a combiner with the first communications device serving as a splitter and collectively configured as a splitter and combiner combination; a first RF output and a second RF output of the splitter section is connected as inputs into first and second inputs of the combiner.

BRIEF DESCRIPTION OF THE DRAWINGS

In order to facilitate a full understanding of the present invention, reference is now made to the accompanying drawings, in which like elements are referenced with like numerals. These drawings should not be construed as limiting the present invention, but are intended to be exemplary and for reference.

DETAILED DESCRIPTION OF THE PREFERRED EMBODIMENT

The present invention will now be described in more detail with reference to exemplary embodiments as shown in the accompanying drawings. While the present invention is described herein with reference to the exemplary embodiments, it should be understood that the present invention is not limited to such exemplary embodiments. Those possessing ordinary skill in the art and having access to the teachings herein will recognize additional implementations, modifications, and embodiments, as well as other applications for use of the invention, which are fully contemplated herein as within the scope of the present invention as disclosed and claimed herein, and with respect to which the present invention could be of significant utility.

The present invention provides a high power RF splitter/combiner that operates without the inconvenience of the balanced isolation load requirement of the Wilkinson splitter/combiner topology—i.e. the isolation load returns to ground rather than being connected between a pair of floating nodes. The splitter-combiner of the present invention also has several other advantages over other configurations such as non-homogeneous microstripline combiners as well as homogeneous stripline configurations. For instance, the coaxial nature of the splitter-combiner of the present invention offers excellent shielding thereby minimizing electromagnetic radiation and the attendant undesirable cross-coupling with other parts of the system. The invention, as a consequence of the above noted advantage, provides a simple and inexpensive housing can be used when compared to the housing necessary to shield a microstripline combiner. In the case of stripline combiners, that are also self-contained, much higher accuracy of the fabrication process is required for proper operation. Further, for high power applications the cost of substrate materials becomes a significant a factor. The use of air as the dielectric for stripline structures is sometimes used but the final structure is always a complicated and expensive mechanical assembly.

In addition, the splitter/combiner of the present invention can operate over one octave with no degradation of the improved isolation between ports. To get the same performance in other type of structures it would be necessary to use cascaded multi-section lines which again would involve more critical and expensive structures.

A further advantage of the present invention is that power scalability is achieved simply by using higher power coaxial cables, a higher power-rated isolation load, and connectors with suitable power rating. Common prior art structures would need to be totally re-engineered to withstand the higher power.

Figure 1:
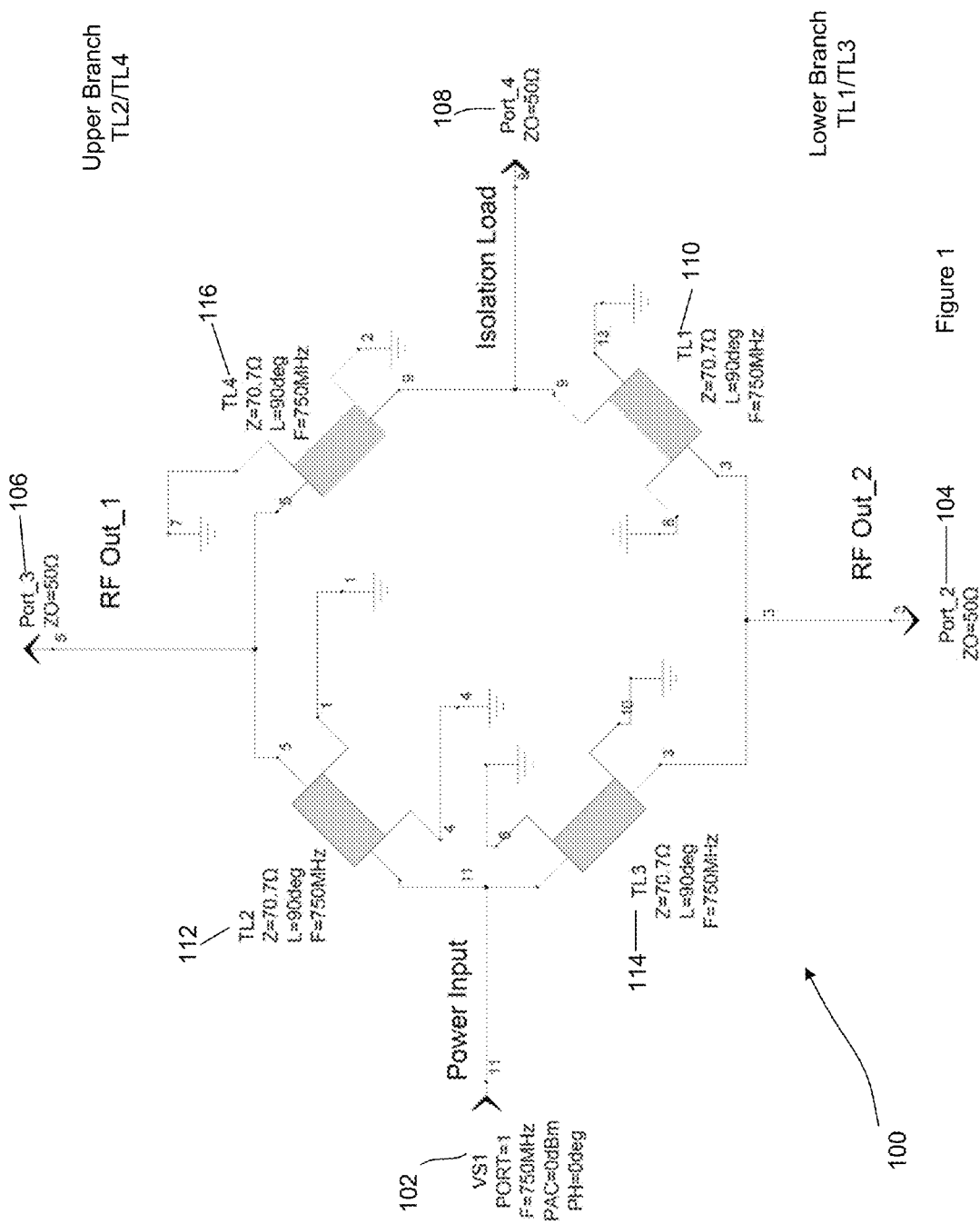
FIG. 1 is a schematic of a first embodiment of a splitter of the present invention for use in Radio Frequency (RF) amplifier applications.
Figure 2:
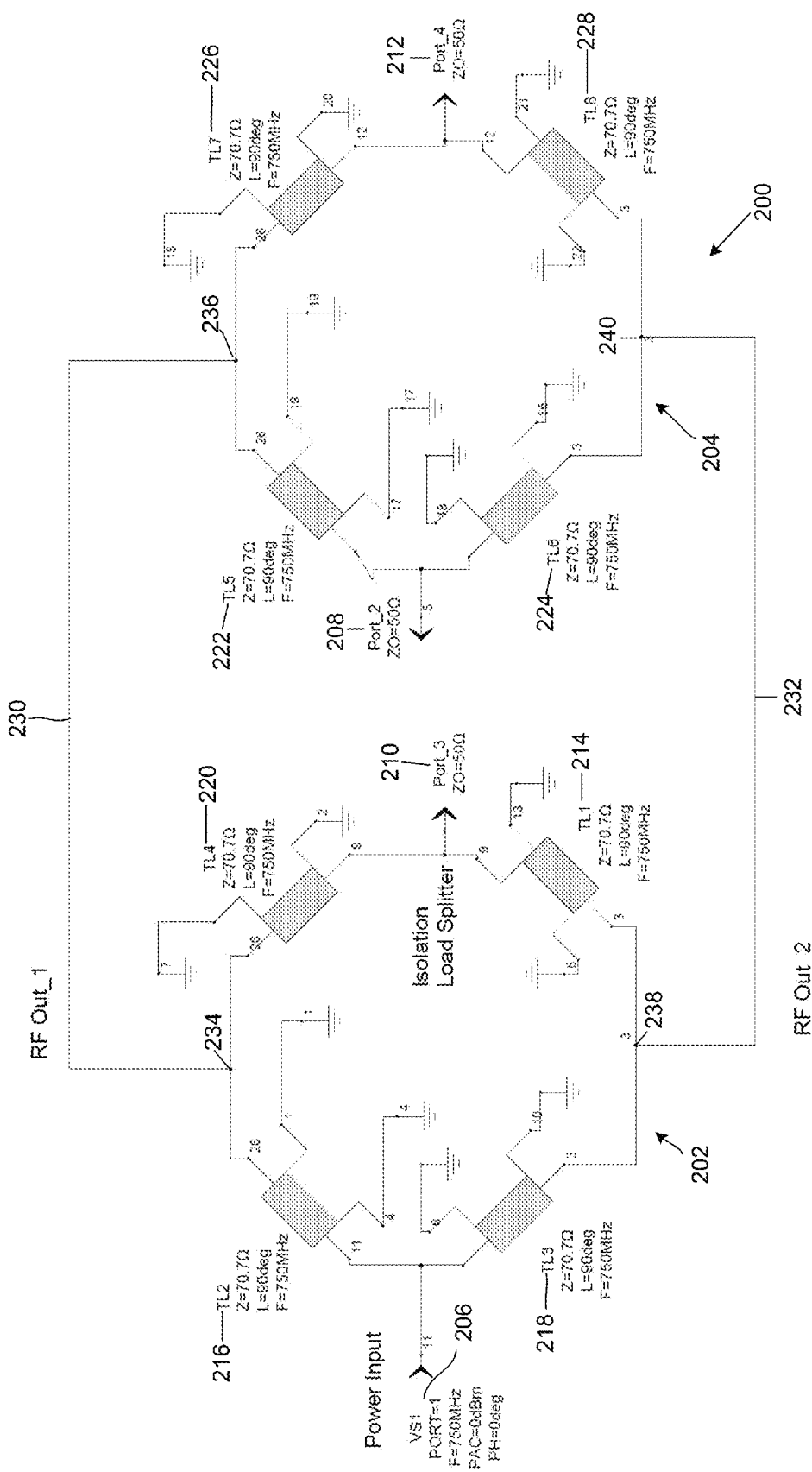
FIG. 2 is a schematic of a second embodiment of a splitter-combiner of the present invention for use in Radio Frequency (RF) amplifier applications.
Figure 3:
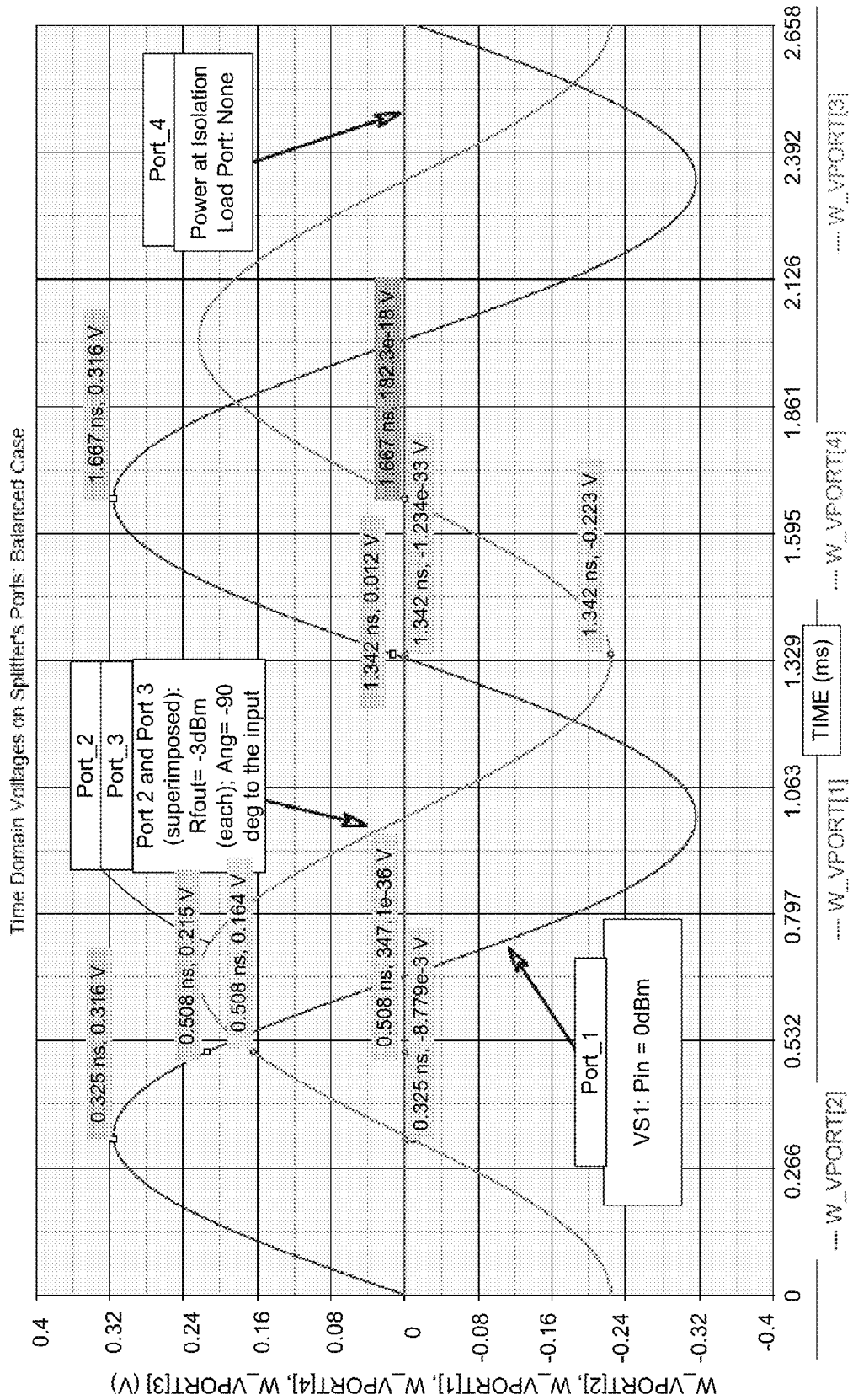
FIG. 3 is graph illustrating Time Domain Voltages on Splitter Ports—Balanced Case.
Figure 4:
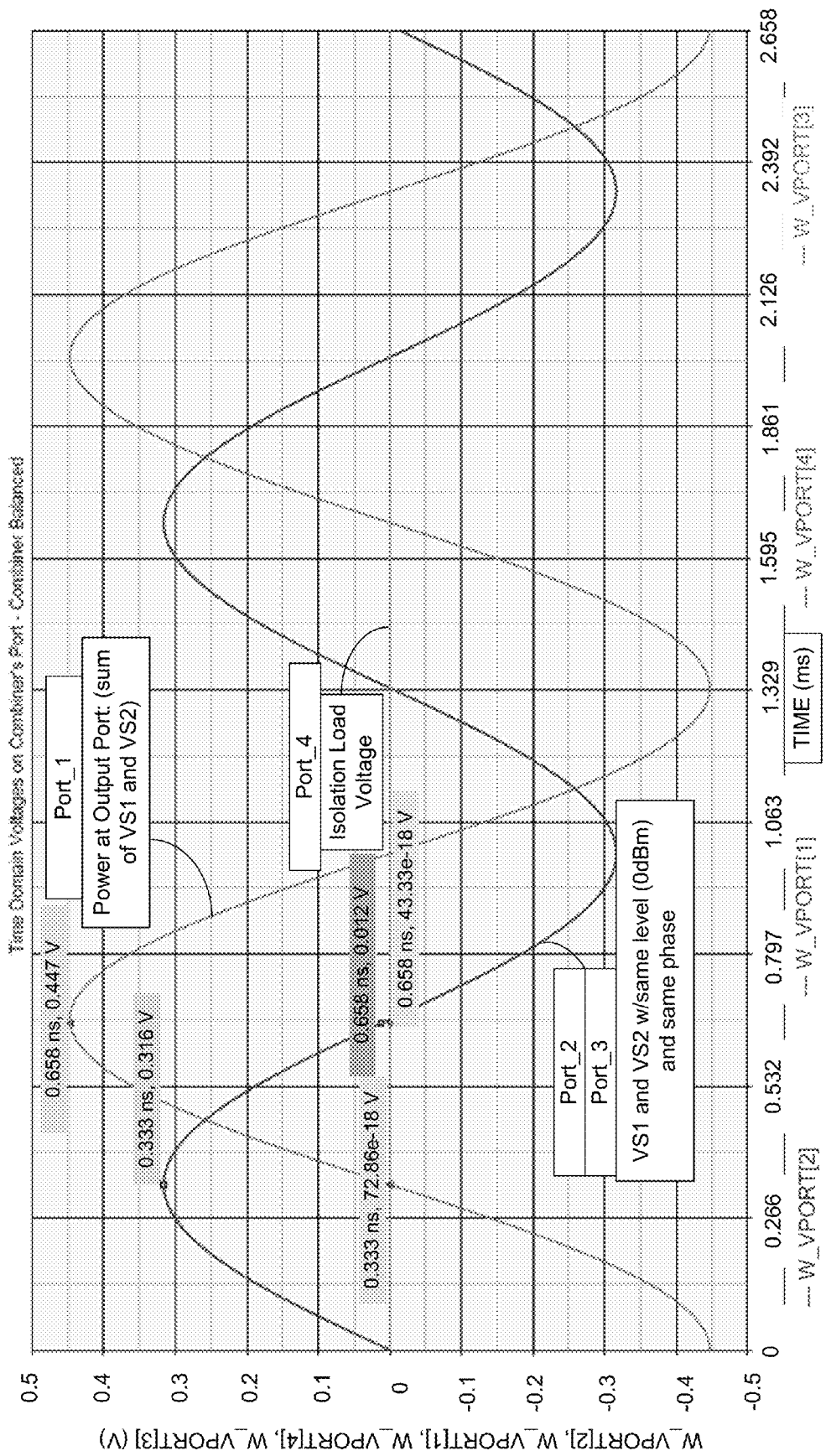
FIG. 4 is a graph illustrating Time Domain Voltages on Combiner Ports—Combiner Balanced.
Figure 5:
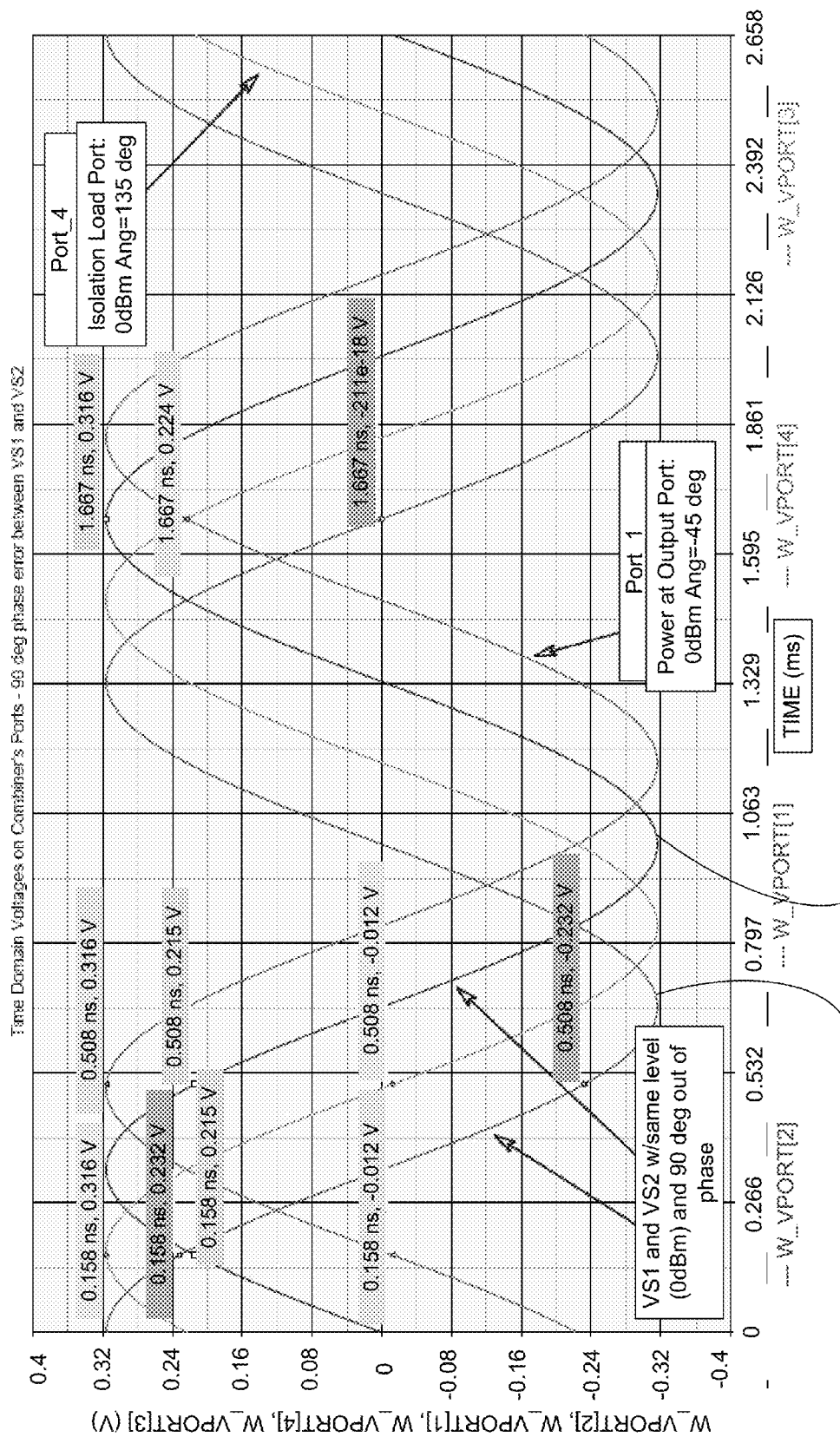
FIG. 5 is a graph illustrating Time Domain Voltages on Combiner Ports—90 degree phase error between VS1 and VS2.
Figure 6:
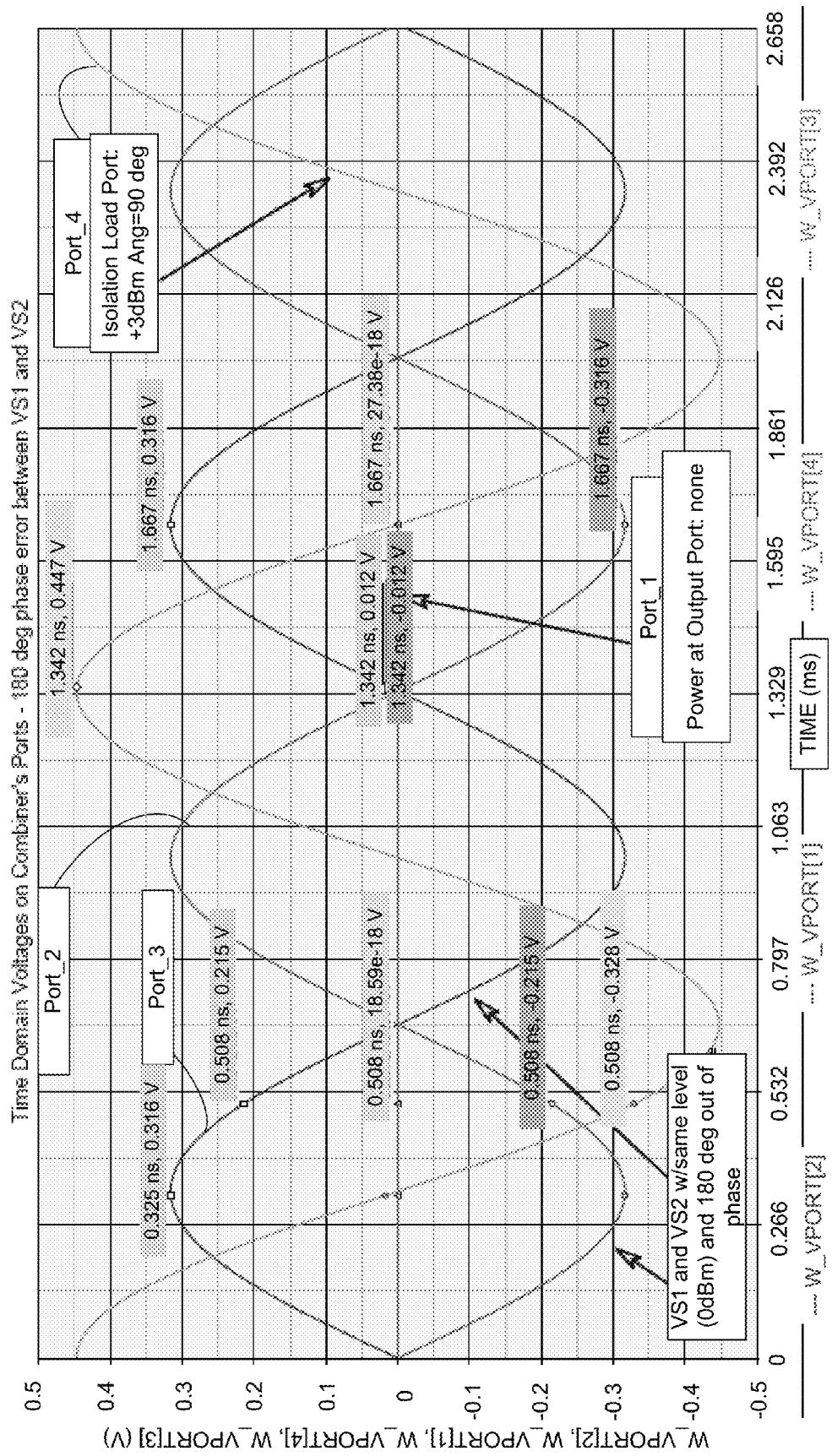
FIG. 6 is a graph illustrating Time Domain Voltages on Combiner Ports—180 degree phase error between VS1 and VS2.
Figure 7:
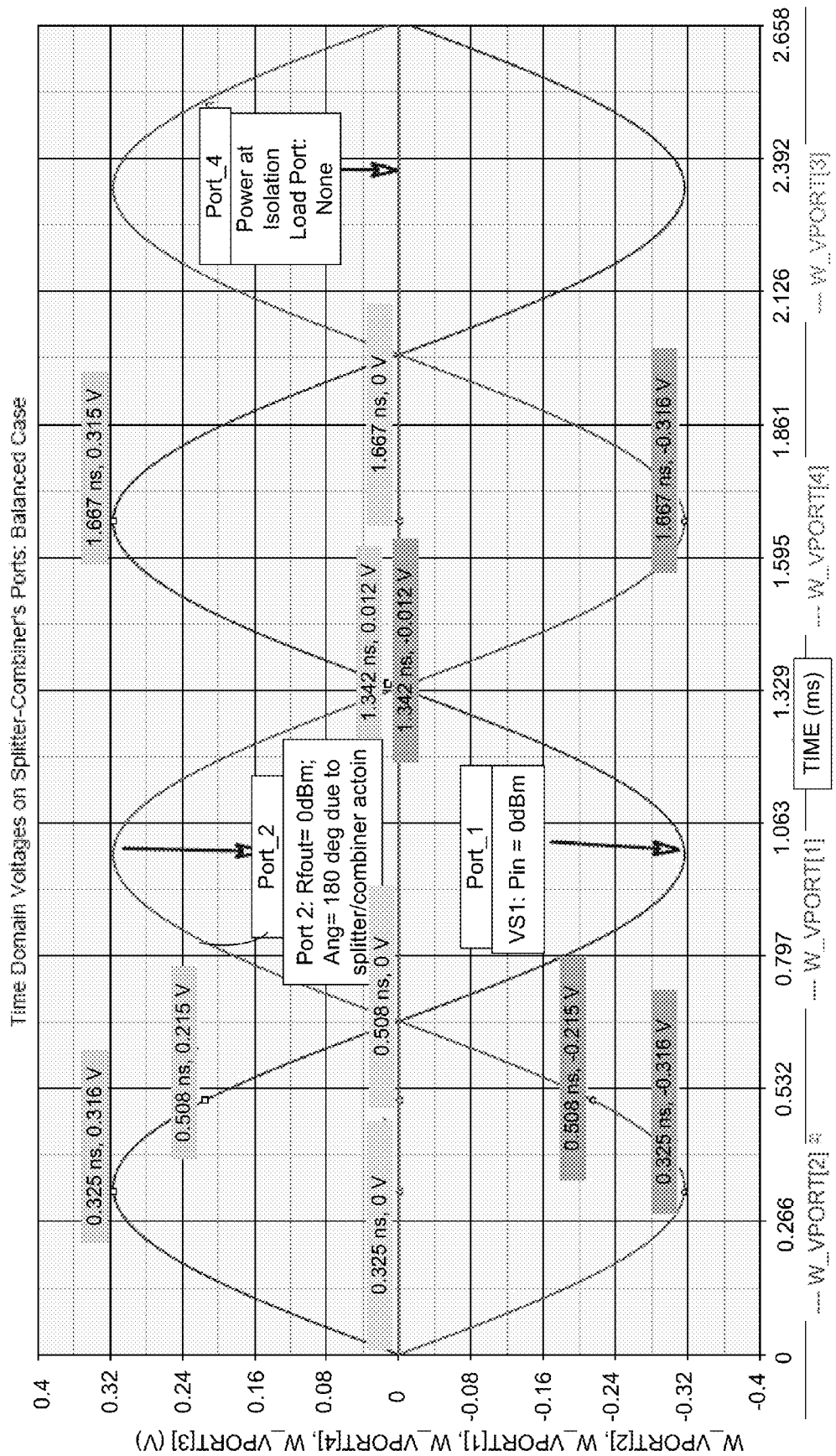
FIG. 7 is a graph illustrating Time Domain Voltages on Splitter-Combiner Ports—Balanced Case.

FIG. 1 illustrates a splitter in accordance with the present invention and FIG. 2 illustrates a splitter-combiner in accordance with the present invention. FIG. 3 is a graph illustrating Time Domain Voltages on Combiner Ports—90 degree phase error between VS1 and VS2. FIG. 4 is a graph illustrating Time Domain Voltages on Combiner Ports—180 degree phase error between VS1 and VS2. FIG. 5 is a graph illustrating Time Domain Voltages on Combiner Ports—Combiner Balanced. FIG. 6 is graph illustrating Time Domain Voltages on Splitter Ports—Balanced Case. FIG. 7 is a graph illustrating Time Domain Voltages on Splitter-Combiner Ports—Balanced Case.

With reference to the circuits of FIGS. 1-2 and the related time domain voltage graphs of FIGS. 3-7, the present invention operates as follows.

FIG. 1 is a schematic of a first embodiment of a combiner or splitter 100 of the present invention for use in Radio Frequency (RF) amplifier applications. The combiner or splitter 100 is shown in a splitter configuration and has a Port_1 102, Port_3 106, Port_2 104, Port_4 108, and transmission line transformers (TL) TL1 110, TL2 112, TL3 114, and TL4 116.

The isolation and output loads, both 50 ohms, are transformed to 100 ohms through TL2 112 and TL4 116 for the upper branch and TL3 114 and TL1 110 for the lower branch. As shown in the circuit diagrams, these 100 Ohms impedances are in parallel on each branch, making an effective impedance of 50 Ohms for proper loading of the power sources.

In this embodiment, at each of TL1 110, TL2 112, TL3 114, and TL4 116, the risk impedance, Z, is 70.7 ohms. The electrical length of line, L, is 90 degrees or ¼ lambda, where lambda is 360 degrees. The frequency, F, is centered at 750 MHz at 90 degrees. Using coaxial cable, the frequency output can be increased to a maximum of 1.5 GHz. Each of TL1 110, TL2 112, TL3 114, and TL4 116, in this embodiment are coaxial cables, but may also be in stripline or microstripline configurations. The splitter-combiner 100 is most stable using a coaxial cable configuration. Coaxial cables have a normal power ratio. The limit of the maximum power (in Hz) is the load connected to the isolation load at port four 108. In this exemplary embodiment transmission lines TL1-TL4 are in the form of coaxial cable comprising a center conductor coaxially surrounded by an insulator and then a shielded conductor. In keeping with the invention, both ends of the shielded conductor of TL 2, TL3 and TL4 are connected to ground, whereas one end of the shielded conductor of TL1 is connected to ground while the other conductor is connected to the center conductor of TL4, thus grounding the isolation load. One end of the central conductor of TL1 is connected to Port_2 104, RF Out 2, while the other end is connected to ground. In this manner the invention grounds the isolation load at Port_4 108 in stark contrast to floating nodes of a Wilkinson splitter/combiner. In this manner the invention avoids the problems of stray capacitance and stray inductance associated with the Wilkinson splitter design.

The isolation load connected at Port_4 108 in combiner or splitter 100 is used to absorb a power unbalance. The isolation load at Port_4 108 may either be provided as an external connection available to the user, or as an internal load in a "data sheet" configuration. In a data sheet configuration it is up to the user to limit the power input at Port_1 102 as the power input cannot be allowed to cross the maximum power ratio for the internal isolation load resistance. The data sheet configuration also has the additional benefit of enabling the combiner or splitter 100 to be a more compact device. In the eternal connection configuration the isolation load connected at Port_4 108 may be changed based on the input power at Port_1 102.

In a Wilkinson splitter, the splitter has a problem with stray capacitance and inductance, especially when two Wilkinson splitters are used in sequence. Any stray signal that is "floating" that does not go to ground contributes to this problem. In this embodiment of the present invention the problem of stray capacitance and inductance is solved by connecting the core of the coaxial TL4 116 to the external braid or shielding of TL1 110 which is connected to ground and by connecting the core of coaxial TL1 110 to ground. This "crisscrossed" configuration solves the stray capacitance and inductance problems normally presented when using a sequence of two Wilkinson splitters. Furthermore, one or more of the combiner or splitter 100 may combined in a "daisy chain" configuration to further increase the number of output signals to, e.g., 4 or 8.

With reference now to FIG. 2, a schematic drawing for a splitter-combiner 200 is shown. The splitter-combiner 200 comprises a splitter 202 and a combiner 204. The splitter 202 comprises Port_1 206, Port_3 210, RF Out_1 234, RF Out_2 238, and TL1 214, TL2 216, TL3 218, and TL4 220. Port_3 210 is connected to an isolation load that absorbs any power imbalance in the splitter 202. The outputs at RF Out_1 234 and RF Out 2 238 may be connected to one or more amplifiers at connections 230 and 232 respectively.

RF Out_1 234 and RF Out_2 238 from splitter 202 are connected to RF In_1 236 and RF In_2 240 at combiner 204 respectively. The signal that was split at splitter 202 is combined in combiner 204 and output at Port_2 208. An isolation load to absorb any signal imbalance in the combiner 204 is connected at Port_4 212. Combiner 204 also comprises TL5 222, TL6 224, TL7 226, and TL8 228. As with TL1 110 and TL4 116 in FIG. 1, the pairs of TL1 214 and TL4 220, and TL8 228 and TL7 226 in FIG. 2 are connected in a crisscross configuration to solve the problem of stray capacitance and inductance that would normally be a problem in a Wilkinson splitter at higher powers.

The two signals at RF In_1 236 and RF In_2 240 should be essentially equal in both amplitude and phase. If there is a mismatch in either amplitude or phase the resulting time domain voltage will be that shown in FIGS. 5 and 6. The behavior of the combiner for a lack of amplitude and phase tracking is presented in FIGS. 5 and 6. One can see the combiner's degradation is more severe for a phase error between VS1 and VS2.

With reference now to FIG. 3, a graph illustrating the time domain voltages on splitter ports: balanced case, is provided. The graph in FIG. 3 shows a balanced power case for the combiner or splitter 100 in a splitter configuration as shown in FIG. 1. In this case, power input is connected at Port_1 102, VS1, and an isolation load is connected at Port_4 108. The split signal is output at Port_2 104 and Port_3 106. Here the power input at Port_1 102 is 0 dBm, and there is no power at the isolation load Port_4 108. The output at Port_2 104 and Port_3 106 is shown superimposed and is −3 dBm at an angle −90 degrees to the input. The graph in FIG. 3 shows a low power embodiment for the splitter 100 shown in FIG. 1, but the splitter 100 may also be configure to operate at higher powers, a maximum of 1.5 GHz for coaxial cables.

With reference now to FIG. 4, a graph illustrating the time domain voltages on combiner ports: balanced case, is provided. The graph in FIG. 4 shows a balanced power case for the combiner or splitter 100 as shown in FIG. 1 in a combiner configuration. In a combiner configuration, the combiner or splitter 100 would have power input connected to Port_2 104 and Port_3 106, an isolation load connected to Port_4 108, and the power output would be at Port_1 102. The power at the output port, Port_1 102, would be the sum of the power at the input ports, VS1 and VS2, Port_2 104 and Port_3 106 respectively. The power input at Port_2 104 and Port_3 106 is at the same level, 0 dBm, and at the same phase. It can be seen that the isolation load voltage at Port_4 108 is zero when the power load is balanced.

With reference now to FIG. 5, a graph illustrating the time domain voltages on combiner ports: 90 degree phase error between VS1 and VS1, is provided. Inputs VS1 and VS2 are connected at Port_2 104 and Port_3 106 as seen in FIG. 1, respectively. In this example, an isolation load is connected to Port_4 108. Due to the fact that the isolation load is connected to points which are 90 degrees out of phase, the power flowing through the isolation load at Port_4 108 will be at 0 dBm at an angle of 135 degrees relative to the power at the inputs VS1 at Port_2 104 and VS2 at Port_3 106, and the power presented to the RF output port, Port_1 102, is at 0 dBm at −45 degrees relative to the power applied to each power input port VS1 at Port_2 104 and VS2 at Port_3 106.

With reference now to FIG. 6, a graph illustrating the time domain voltages on combiner ports: 180 degree phase error between VS1 and VS1, is provided. Inputs VS1 and VS2 are connected at Port_2 104 and Port_3 106 as seen in FIG. 1, respectively. In this example, an isolation load is connected to Port_4 108. Due to the fact that the isolation load is connected to points which are 180 degrees out of phase, there will be no power flowing through the isolation load at Port_4 108, and the power presented to the RF output port, e.g. Port_1 102, is 3 dB above the power applied to each power input port Port_2 104 and Port_3 106.

For an extreme situation where the load is totally lost (opened or shorted), the following parameters apply: the input return loss presented by the combiner to VS1 and VS2 is brought to 6 dB; the isolation between VS1 and VS2 is brought to 7 dB; the isolation between the load and VS1 and VS2 is brought to 10 dB; and the power dissipated in the isolation load is equal to Pvs1+Pvs2.

With reference now to FIG. 7, a graph representing the time domain voltages on splitter-combiner's ports: balanced case, is provided. In this graph, power input is connected to VS1 at Port_1 206, and an isolation load is connected to the isolation load Port_4 212 as seen in FIG. 2. Output is at VS2 at Port_2 208. In this graph, the input at VS1 at Port_1 206 is 0 dBm, there is no power at the isolation load Port_4 212, and the power output at VS2 at Port_2 208 is balanced at 0 dBm at 180 degrees relative to the input at VS1 at Port_1 206 due to the combined effect of the action of the splitter 202 and combiner 204 in the splitter-combiner 200. This graph shows that there no phase difference or amplitude imbalance in the power output at VS2 at Port_2 208.

Figure 8:
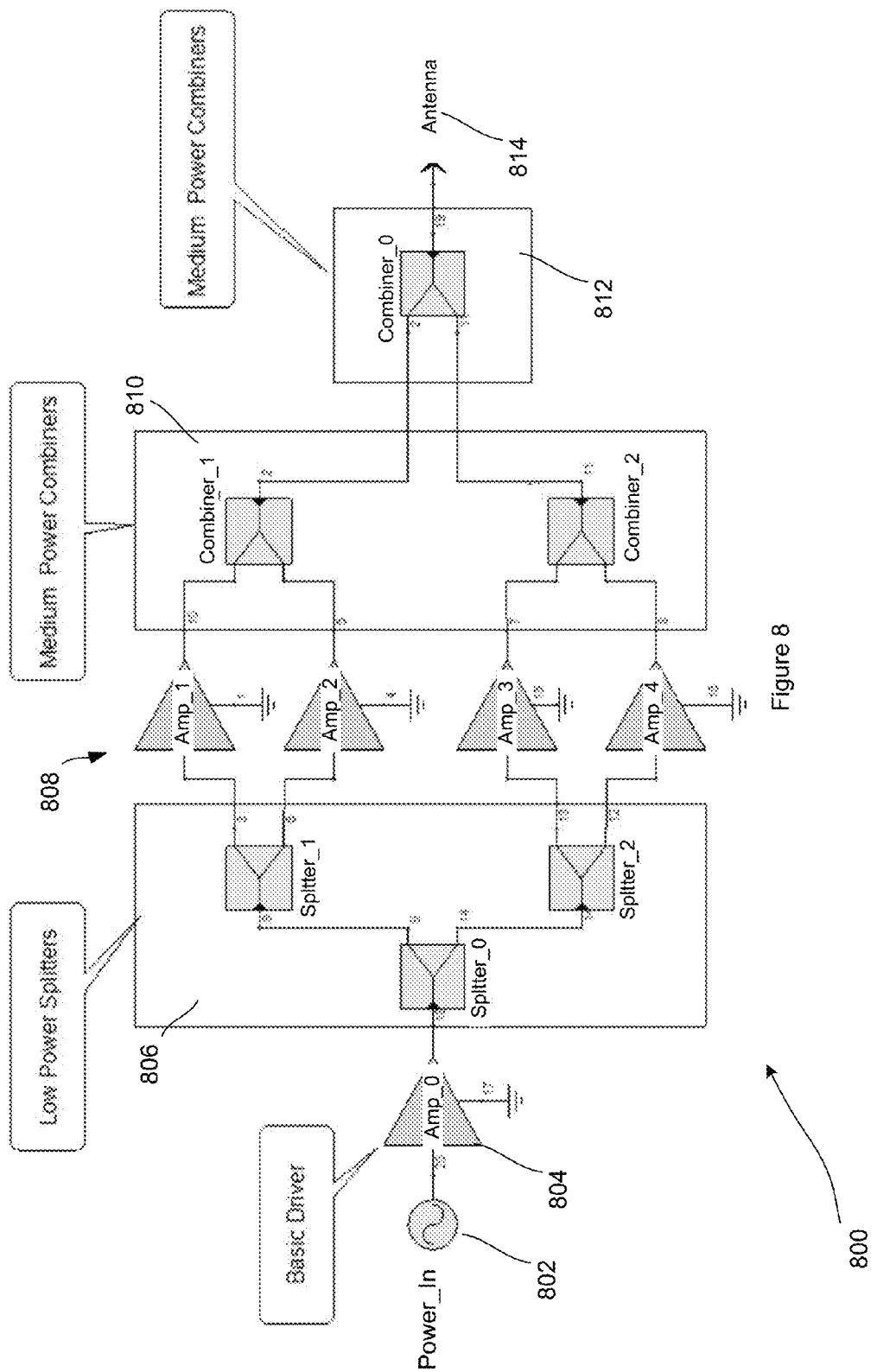
FIG. 8 is a schematic of an embodiment of a set of low power splitters, amplifiers, and medium power combiners for multi-kilowatt operation.

With reference now to FIG. 8, a schematic of an embodiment of a set of low power splitters, amplifiers, and medium power combiners for multi-kilowatt operation is provided. The splitter-combiner 800 is comprised of a power input 802, a basic driver 804, a set of low power splitters 806, a set of amplifiers 808, a set of medium power combiners 810, and final combiner 812. The power input from power input 802 is split from 1 to 4 and then each signal is individually amplified by an amplifier from the set of amplifiers 808. The amplified signals are then combined first by the medium power combiners 810 and then by the final combiner 812 to generate a greatly amplified, high power signal that is output at antenna 814. Several blocks of the splitter-combiner 800 may be combined for multi-kilowatt operation. All individual splitters and combiners in the set of low power splitters 806, medium power combiners 810, and final combiner 812 are build using the same structure as the combiner or splitter 100 depicted in FIG. 1. The isolation load on each splitter and combiner in the splitter-combiner 800 is chosen based according to the splitter-combiner power ratio. Each isolation load is connected to ground. The splitter-combiner 800 enables for easy implementation of one octave, multi-kilowatt operation. In kilowatt operation, a single splitter-combiner 800 may have the isolation load connected outside of the splitter-combiner unit 800, without any change to the structure of the splitter-combiner 800

The present invention is not to be limited in scope by the specific embodiments described herein, It is fully contemplated that other various embodiments of and modifications to the present invention, in addition to those described herein, will become apparent to those of ordinary skill in the art from the foregoing description and accompanying drawings. Thus, such other embodiments and modifications are intended to fall within the scope of the following appended claims. Further, although the present invention has been described herein in the context of particular embodiments and implementations and applications and in particular environments, those of ordinary skill in the art will appreciate that its usefulness is not limited thereto and that the present invention can be beneficially applied in any number of ways and environments for any number of purposes. Accordingly, ultimately claims of the present invention should be construed in view of the full breadth and spirit of the present invention as disclosed herein.

What is claimed is:

1. An RF communications device capable of being used as a splitter or a combiner, the communications device comprising:

at least three ports, wherein:

when used as the splitter, a first port serving as an RF input, second and third ports providing a first RF output and a second RF output, respectively;

when used as the combiner, the first port serving as an RF output, the second and third ports connectable to a first RF input and a second RF input, respectively;

at least four transmission line elements, each comprising a first conductor element and a second conductor element, wherein at least three of the transmission line elements are configured so that each one of the first conductor elements are in electric communication with an RF signal and each one of the second conductor elements are in electric communication with a ground reference, and at least one of the transmission line elements are configured so that the first conductor element is in electric communication at one end with the ground reference and at the other end with the RF signal and the second conductor element is in electric communication at one end with the ground reference and at the other end with an isolation load element, which is also in electric communication with one of the first conductor elements of another one of the transmission line elements; whereby the isolation load is grounded.

2. The communications device of claim 1, wherein the transmission line elements are one or more of a coaxial cable, a stripline or a microstripline.

3. The communications device of claim 1 further comprising a fourth port associated with the isolation load element, the fourth port being accessible externally.

4. The communications device of claim 1, wherein the isolation load element is internal the communications device and not accessible externally.

5. The communications device of claim 1 further comprising a second communications device coupled serving as a combiner with the first communications device serving as a splitter and collectively configured as a splitter and combiner combination.

6. The communications device of claim 5, wherein the first RF output and the second RF output of the splitter are connected as inputs into the first and second RF inputs of the combiner.

7. The communications device of claim 6 wherein the first and second RF output signals of the splitter are connected to a set of amplifiers having a set of outputs with the set of outputs of the set of amplifiers providing the first and second inputs to the combiner.

8. The communications device of claim 1, wherein N×M communications devices are cascaded together to provide N×M splitter/combiner configuration for use in a communications system.

9. A method for splitting or combining an RF signal comprising:
configuring a communications device comprising at least three ports, and at least four transmission line elements, each comprising a first conductor element and a second conductor element, wherein at least three of the transmission line elements are configured so that each of the first conductor elements are in electric communication with an RF signal and each of the second conductor elements are in electric communication with a ground reference, and at least one of the transmission line elements are configured so that the first conductor element is in electric communication at one end with the ground reference and at the other end with the RF signal and the second conductor element is in electric communication at one end with the ground reference and at the other end with an isolation load element, which is also in electric communication with one of the first conductor elements of another one of the transmission line elements, whereby the isolation load is grounded, for either splitting or combining the RF signal wherein the splitting comprises:
splitting the RF signal by connecting to the communications device an RF input to a first port of the at least three ports, a first RF output to a second port of the at least three ports, and a second RF output to a third port of the at least three ports; and
wherein the combining comprises:
combining the RF signal by connecting to the communications device an RF output to a first port of the at least three ports, a first RF input to a second port of the at least three ports, and a second RF input to a third port of the at least three ports.

10. An RF communications device capable of being used as a splitter or a combiner, the communications device comprising:
four transmission line elements, wherein each of the transmission line elements comprises a conductive core and a conductive shielding layer, the conductive core and conductive shielding layers each having a first end and a second end and separated by an insulating layer;
a first port disposed between a first and second transmission line element of the four transmission line elements, the first port in electrical communication with the first end of the conductive core of the first transmission line element and the first end of the conductive core of the second transmission line element, and wherein the first end and the second end of the conductive shielding layer of the first and second transmission line elements is in electrical communication with ground;
a second port disposed between the first and a third transmission line element of the four transmission line elements, the second port in electrical communication with the second end of the conductive core of the first transmission line element and the first end of the conductive core of the second transmission line element, and wherein the first end and the second end of the conductive shielding layer of the third transmission line element is in electrical communication with ground;
a third port disposed between the second and a fourth transmission line element of the four transmission line elements, the third port in electrical communication with the second end of the conductive core of the second transmission line element and the first end of the conductive core of the fourth transmission line element, and wherein the first end of the conductive shielding layer of the fourth transmission line element is in electrical communication with ground; and
an isolation load disposed between the third and fourth transmission line elements, the isolation load in electrical communication with the second end of the conductive core of the third transmission line element and the second end of the conductive shielding layer of the fourth transmission line element, and wherein the second end of the conductive core of the fourth transmission line element is in electrical communication with ground.

* * * * *